United States Patent [19]

Edwards

[11] Patent Number: 5,515,293
[45] Date of Patent: May 7, 1996

[54] METHOD AND APPARATUS FOR GENERATING A LINKED DATA STRUCTURE FOR INTEGRATED CIRCUIT LAYOUT

[75] Inventor: Lawrence B. Edwards, San Jose, Calif.

[73] Assignee: VLSI Technology, Inc., San Jose, Calif.

[21] Appl. No.: 172,449

[22] Filed: Dec. 22, 1993

[51] Int. Cl.$^6$ .................................................. G06F 17/50
[52] U.S. Cl. ............................................ 364/489; 364/488
[58] Field of Search ................................. 364/488, 489, 364/490, 491; 395/600

[56] References Cited

U.S. PATENT DOCUMENTS

| | | | |
|---|---|---|---|
| 4,872,103 | 10/1989 | Kingsley | 364/491 |
| 5,164,908 | 11/1992 | Igarashi | 364/491 |
| 5,206,815 | 4/1993 | Purcell | 364/491 |
| 5,212,650 | 5/1993 | Hooper et al. | 364/489 |
| 5,267,177 | 11/1993 | Sato et al. | 364/491 |
| 5,303,161 | 4/1994 | Burns et al. | 364/490 |
| 5,341,309 | 8/1994 | Kawata | 364/489 |

*Primary Examiner*—Vincent N. Trans
*Attorney, Agent, or Firm*—Flehr, Hohbach, Test, Albritton & Herbert

[57] ABSTRACT

A method an apparatus for generating and storing a connectivity data structure representing a circuit layout. The data structure includes a list of pointers representing cells of the layout, and each cell pointer points to an entry in a cell table. The cell table entries include a field pointing to a cell types table, and another entry pointing to a boundary table, which itself stores fields identifying edges and adjacent cells. The edge entries point to an edge table including fields representing the endpoints of the edge. The endpoint fields point to a point table including coordinates of the endpoint in question and a move field identifying whether the edge has been moved in a layout modification routine. The method of generating this data structure involves entering a layout, adding new cells one by one, and when each new cell is added, generating entries for all the cells, boundaries, edges and edge endpoints of the new cell, and storing them in the data structure. As the cells are entered, they are fractured to generate horizontal edges and convex shapes, and once all cells are entered, cells of like materials are recombined while maintaining convexity. Links are generated for cells connected across layers of the layout. The apparatus of the layout is a computer system including a inputs and a CPU controlling a memory storing a program for generating all of the objects in the data structure, allowing simple user input of graphical objects representing the objects in the circuit layout.

12 Claims, 11 Drawing Sheets

METHOD AND APPARATUS FOR GENERATING A LINKED DATA STRUCTURE FOR INTEGRATED CIRCUIT LAYOUT

The present invention relates to the generation of a connectivity data structure representing an integrated circuit layout.

BACKGROUND OF THE INVENTION

In the design of integrated circuits (ICs), the creation and maintenance of databases representing the layouts is an important process. Such databases must store information reflecting the cells of the IC layout, their connectivity, layer information and spatial relationships.

Edges of objects (such as a material represented in a particular shape) in an IC layout share coordinate data in existing systems, which is important for procedures that perform operations that act on the coordinates of the layout, in particular on these shared edges. This is because an operation that affects a particular coordinate point on an edge affects all layout structures adjacent that edge.

Types of data structures presently used for this purpose include "corner stitching" and "trapezoidal corner stitching". These corner stitching approaches link adjacent layout edges at the corners. A problem with such structures is that they do not support all angles of layouts, but are limited to either orthogonal layouts (with corner stitching) or 45° angles in the layouts (with trapezoidal corner stitching). This seriously limits the flexibility a designer has in designing an IC layout.

Corner-stitched data structures are also limited by the fact that the linking between objects is accomplished only at the corners, so that an edge-to-corner or edge-to-edge adjacency cannot be represented. Instead, modifications to cells in a circuit layout require that adjacent regions be explored for other structures that might be affected, which is a slow and inefficient manner of layout manipulation.

A data structure for representing IC layouts is needed that will allow linking of all layout edges to other edges, not merely at the corners. A structure is also needed that includes explicit representation of connectivity and spatial relationships among objects in the layout.

Such a structure should optimally accommodate angles in the objects of the layout that may be other than orthogonal or 45°.

SUMMARY OF THE INVENTION

The data structure of the invention stores a list of cell pointers relating to a circuit layout. Each cell pointer points to a cell entry in a cell table. Each cell entry includes a boundary pointer, a type pointer, and a related cell pointer. The type pointer points to an entry in a cell types table, which identifies the type of material for that cell, or whether the cell is a "via" cell or empty. The related cell pointer points to other points to a cell in a neighboring layer of the circuit.

The boundary pointer points to an entry in a boundary table, each such entry identifying cells adjacent to the cell in question. Each boundary table entry includes a "next" field, identifying the next entry, if any, in the table. Finally, Each boundary table also includes a field with a pointer to a record of an edge associated with that boundary.

The edge records are stored in an edge table, and each includes a first point field and a next point field; these represent the endpoints of the edge, and constitute pointers to records in a point table. Each point table record includes an x-field and a y-field, for identifying the coordinates of that point, and a move $\Delta x$ (or $\Delta y$) field, which is used for moving edges in layout manipulation routines, such as a compaction routine.

The above-described structure allows a compaction routine or other layout modification routine to directly access each structure that is adjacent or logically connected to another such structure, which improves greatly the speed at which compaction can be executed. It allows an exhaustive treatment of all logically related objects in a layout in a reliable and efficient manner.

The data structure is generated by adding cells to the layout one at a time, and in each case exhaustively searching the location for the new cell for other objects, and interrelating those objects by generating entries for the data structure.

DESCRIPTION OF THE PREFERRED EMBODIMENTS

The method and apparatus of the invention are directed to the generation of a data structure that meets the above needs, representing a given circuit layout as a linked list of layers, where each layer includes a set of convex polygons (here called "cells"), and each cell is identified as being of a particular material. A layer plane is generated for each layout of the structure, each plane being the full size of the layout, in a manner conventional in the art. Different layer planes correspond generally to different materials used in the final layout, though as discussed below there are connections across layers and there may be overlapping material types in a single layer. The apparatus shown in FIG. 1, discussed below, is used to input and generate connectivity data according to the invention.

Connectivity data structure

Figure 8:
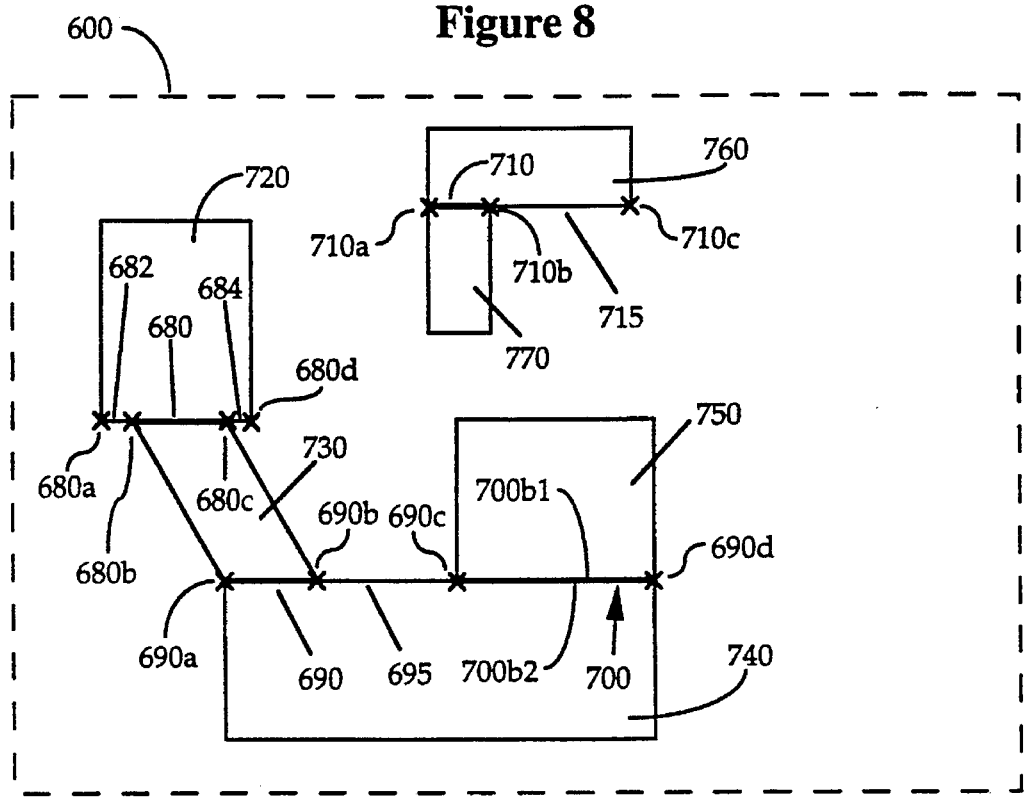
FIG. 8 is a diagram of the layout of FIG. 7, with the cells horizontally sliced to form convex cells.

The features discussed in the following description of the connectivity data structure are graphically represented in the drawings. Reference may be made, for instance, to FIG. 8, which shows cells (720, 730, 740, 750, 760), boundaries (700b1, 700b2), edges (680, 682, 684; 690, 695, 700; etc.) and edge endpoints (680a–680d, etc.). FIG. 8 and the other layouts of the figures are described in detail later.

In general, all final structures are convex, and the space of the layout are fractured into connecting tiles or cells, where each cell is specified as being of a particular type of material (metal, polysilicon, etc.) or is empty, i.e. has no specified material.

Cells representing different materials reside on different layers of the layout, and in general are non-interacting. However, multi-layer cells may be represented, and include contact cuts, or "vias", which are contacts between a given material residing on more than one layer. (For an example of this, see the description below of FIG. 17.) They are represented by duplicating the cell as represented on one layer, placing a representation of the cell on the other layer, and generating a pointer to link the two cells.

The edges of a cell are called the "boundaries". Each boundary includes three parts:

(A) a pointer to an "edge" record that describes the (x, y) coordinates of the boundary;

(B) a pointer to the next boundary of the cell; and (C) a pointer to an adjacent cell, if any, that shares the same edge.

In FIG. 8, for example, cell 750 has an edge 700 defined by endpoints 690c and 690d, and cell 740 shares this edge 700. Cell 750 has a boundary 700b1, and cell 740 has a boundary 700b2, both of which are coextensive with the edge 700, but are represented differently in the data structure and have different functions in manipulating the layout as expressed in that data structure.

The edge record (see A above) in turn contains two pointers, one to each of two "point" records representing the endpoints of the edge. Each endpoint is represented as an (x, y) coordinate. In this application, references to "points" and "endpoints" are synonymous, meaning specifically the endpoints of an edge as specified by a point record.

Edges of adjacent cells, i.e. edges of different cells that touch one another, contain pointers to the same point record. Similarly, the abutting boundaries of adjacent cells contain pointers to the same edge. Thus, adjacent boundaries point to the same edge, and adjacent edges point to the same endpoints. This sharing of edges and endpoints is important for IC computer-aided design (CAD) programs that perform computations on the coordinates of these edges and points while maintaining connectivity among the represented objects.

Cells that include a semiconductor or other material for the layout are referred to as "solid" cells, and those that do not are referred to as "empty" (or "space-filling") cells. Space-filling cells are useful for IC CAD programs that use data reflecting spatial relationships among solid cells.

In summary, all cells share edges, and all edges have defined endpoints, which leads to efficiencies in compaction of the layout. Access to cells adjacent to a given cell can be had directly, without a search, as would be required using a prior method such as corner stitching. This speeds up the rate at which the layout can be manipulated, such as in a compaction procedure.

Figure 2:
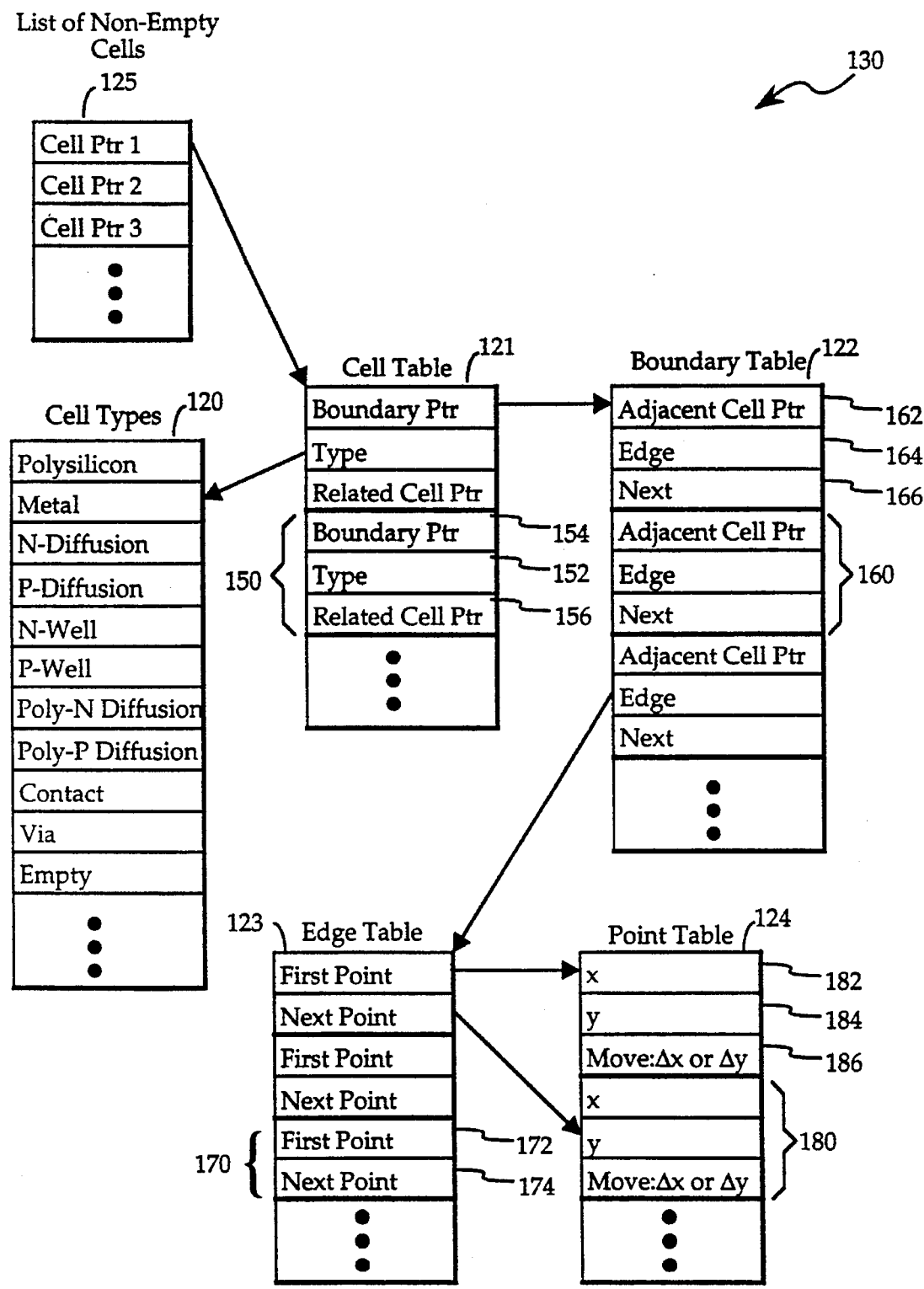
FIG. 2 is a block diagram of a connectivity data structure generated by the method and apparatus of the invention.

FIG. 2 shows the logical relationships among the components of the connectivity data structure 130. Uses of structure are discussed below, and are treated in detail in applicant's copending patent applications System and Method for Compacting Integrated Circuit Layouts, Ser. No. 07/978,558 filed on Nov. 19, 1992, and the continuation-in-part of that application, Method and Apparatus for Compacting Integrated Circuits with Wire Length Minimization, PCT Application No. PCT/US93/11166 filed Nov. 17, 1993 (designating the United States), both of which applications are incorporated herein by reference.

The cell types table 120 lists the different cell types used in the cell representation of the specified circuit layout. The cell types include the traditional layout layers, plus certain "combination" layers such as "Poly-N-diffusion" that represent functionally important overlapping circuit features (such as the transistor channel region defined by polysilicon overlapping a diffusion region), as well as an empty cell type, discussed above. The empty cells in the connectivity data structure are not assigned a layout level, because the connectivity data structure provides a pointer to each other cell that is adjacent to a first cell. Thus, the layout levels of empty cells are implied by the cells to which they are adjacent.

As an alternative to storing cell types in a separate cell types table 120, the cell table 121 could directly include a cell type value as one of its fields; in that case, a cell type pointer would not be needed.

The cell table 121 contains one entry 150 for each cell in the specified circuit layout. Each cell entry 160 has a specified type 152 (one of the types listed in cell type table 120) and a boundary pointer 154 to a linked list of boundary items 160 in the boundary table 122. Each cell 150 also has a slot for storing a "related cell pointer", which points to a cell (called a related cell) in a neighboring layer of the circuit. Examples of related cell pointers include:

(1) a related cell pointer in a diffusion cell to a contact layer cell;

(2) a related cell pointer in a first metal layer cell to a via cell; and (3) a related cell pointer in the via cell to a second metal layer cell.

By following a chain of such related cell pointers, the spacing relationships of material regions on different mask levels can be controlled. Typically, the specified design rules will specify a minimum overlap width requirement for related cells.

The boundary table 122 contains a linked list of four or more boundary items 160 for each cell 150. Each boundary item 160 includes an adjacent cell pointer 162 to the cell on the other side of the boundary, an edge pointer 164 that points to an edge entry in the edge table 123, and a next pointer 166 that points to the next boundary item, if any, in the linked list of boundary items for a cell.

The edge table 123 contains data representing the edges referenced in the boundary table 122. Each edge 170 contains two pointers 172 and 174 to "first" and "next" points in the point table 124. The "first" point represents one endpoint of the edge, and the "next" point represents the other endpoint.

Each endpoint 180 in the point table 124 has an x-coordinate value 182 and a y-coordinate value 184, and a move value 186 which represents movement of the point in either the current direction of compaction (i.e., either the x- or y-direction) when a compaction procedure is carried out on the layout. The compaction procedure does not form a part of the present invention, but the $\Delta x$ and $\Delta y$ fields in the point table are shown for completeness.

It is important to note that each edge 170 is typically referenced by two boundary items, since each edge is shared by two cells. In addition, many points 180 in the point table 124 could be shared by two or more edges, since two or more edges may meet at many of the points in the fractured circuit layout.

The connectivity data structure 130 used by the present invention explicitly represents connectivity between cells by way of both the adjacent cell pointers in the boundary table 122 and the related cell pointers 156 in the cell table 121. The connectivity data structure 130 also explicitly represents empty space with additional cells. Since all cell edges are linked to adjacent cells, connectivity and spacial relationships between neighboring circuit structures can be efficiently accessed or derived without having to search the entire circuit layout.

Cell list 125 is a sorted list of pointers to all the cells in the cell table 121, where the cells are preferably sorted by their lowest x-dimension value (without regard to the cell types of the various cells). Depending upon the compaction procedure (mentioned above) which is used, they may be resorted by their lowest y-dimension value during the compaction process. During such a compaction procedure, the cells in the layout would be processed in the order identified in the cell list 125.

Generation of the IC layout data structure

Figure 1:
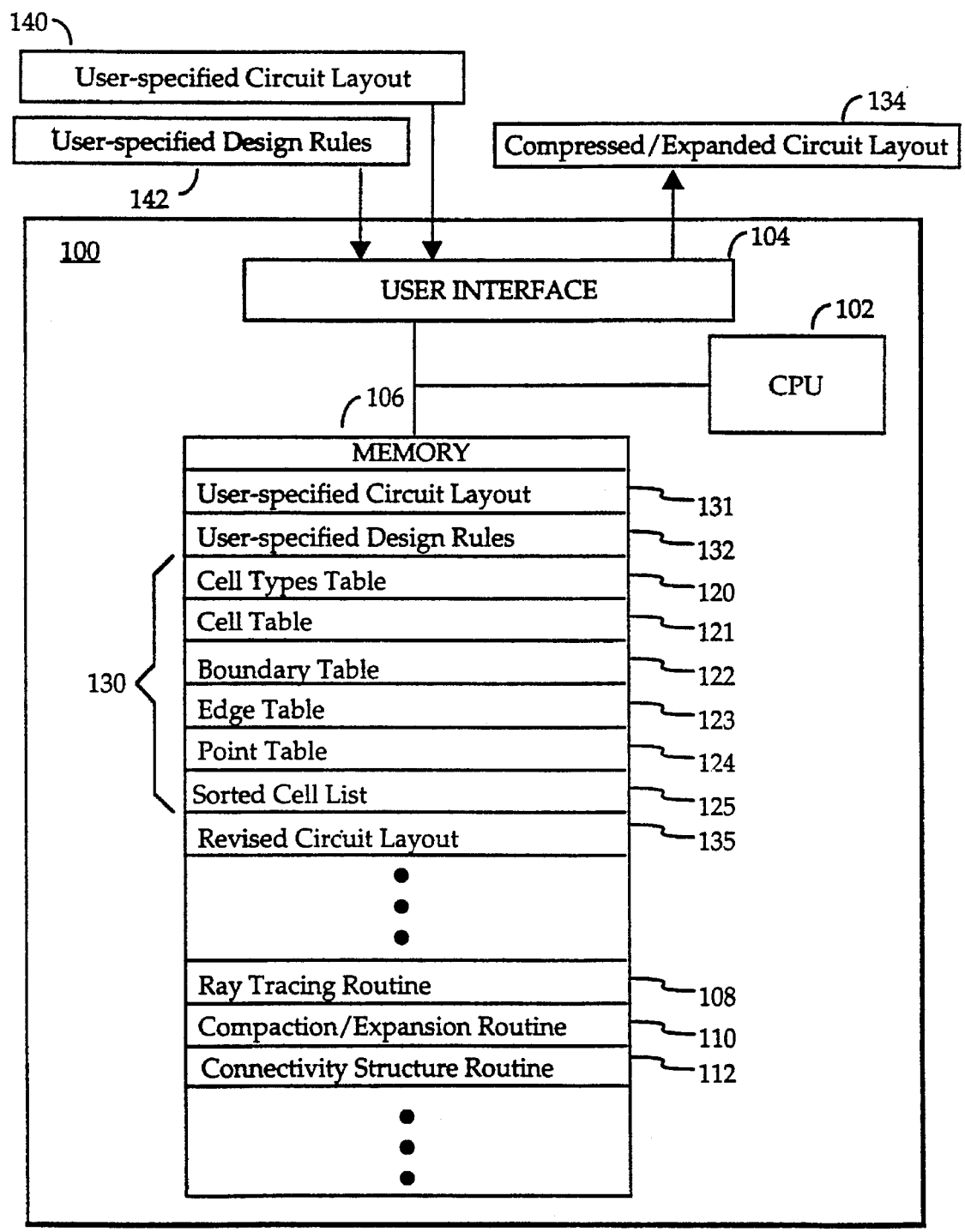
FIG. 1 is a block diagram of apparatus for implementing the present invention.

The present invention is thus directed to the creation of the data structure 130 of FIGS. 1 and 2. A user-specified circuit layout 140 is input via a user interface 104 to a memory 106, under the control of a central processing unit (CPU) 102, and builds up the features of the data structure 130 shown in FIG. 1. The memory 106 may be a disk or any other suitable conventional memory device for storing data structures such as structure 130, software routines such as routines 108–112, and user-specified circuit layout data 131 (input as layout 140) and user-specified design rules 132 (input via the user interface 104 as design rules 142). The design rules are used to generate a compressed or expanded circuit layout 134, which is not the subject of the present invention, but the present invention provides the data structure that supports such layout manipulation. The structure 130 can be used in a compaction procedure, as alluded to above, or in other conventional manners in the design and manufacture of ICs.

Figure 5:
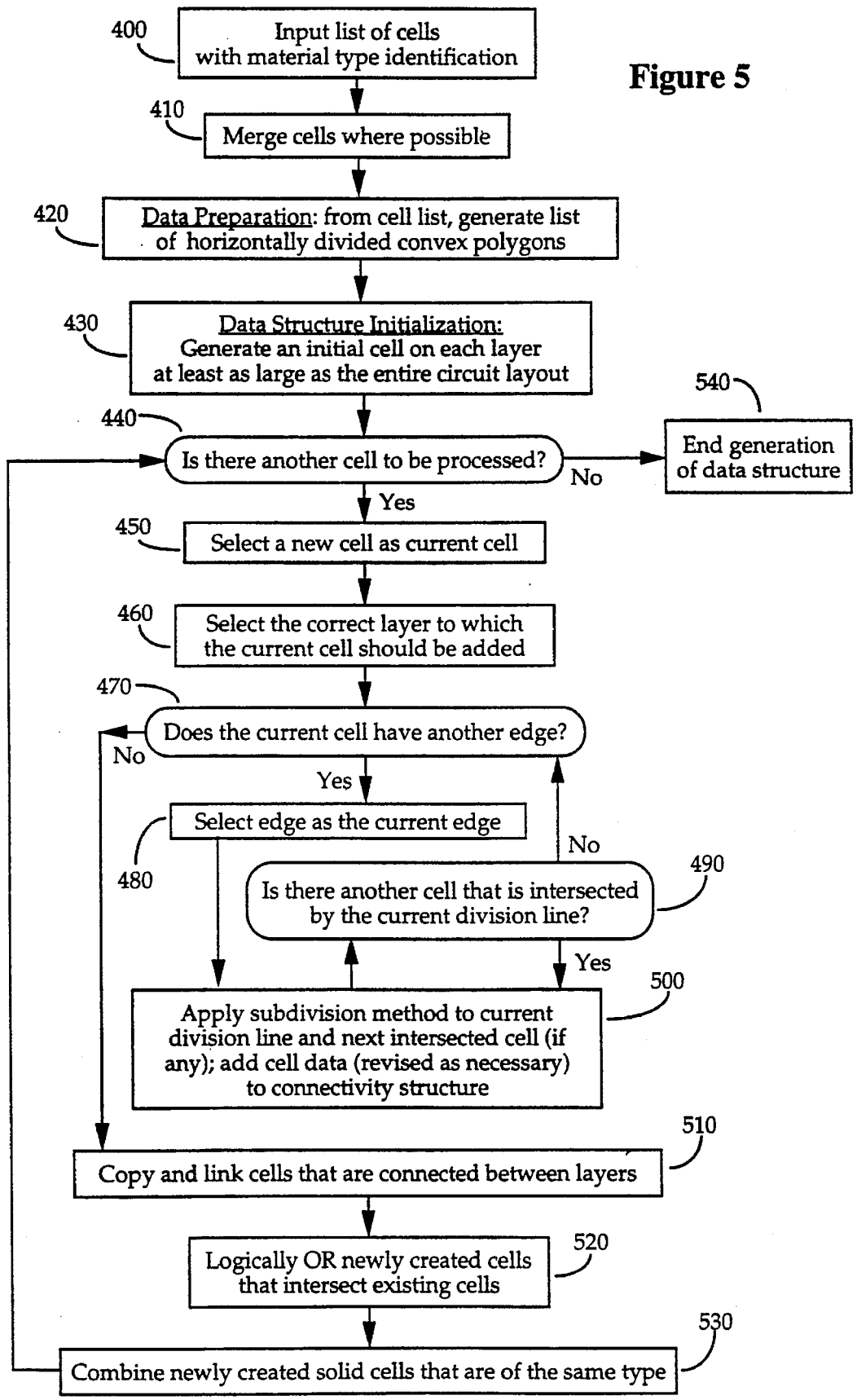
FIG. 5 is a flow chart of the method of the invention for generating a connectivity data structure as in FIG. 2.

The procedure of FIG. 5 automatically adds all cells that are in the input list to the data structure. If the user wishes to add another cell to the list at a later time, thereby modifying the data structure, then the entire procedure may be begun anew, using the previously generated structure plus the new cell as the input list. Alternatively, a "hook" may be provided into the method of FIG. 5, for instance by providing an interface into step 440 that is manually accessible to the user.

The circuit layout 140 is input in the form of a single- or multiple-layer layout. Each new cell is processed one at a time and added in the appropriate layer to the data structure 130, with boundary and edge data corresponding to the physical boundaries and edges of the cell. In addition, empty cells are created, representing the empty spaces surrounding the solid cells.

Figure 3:
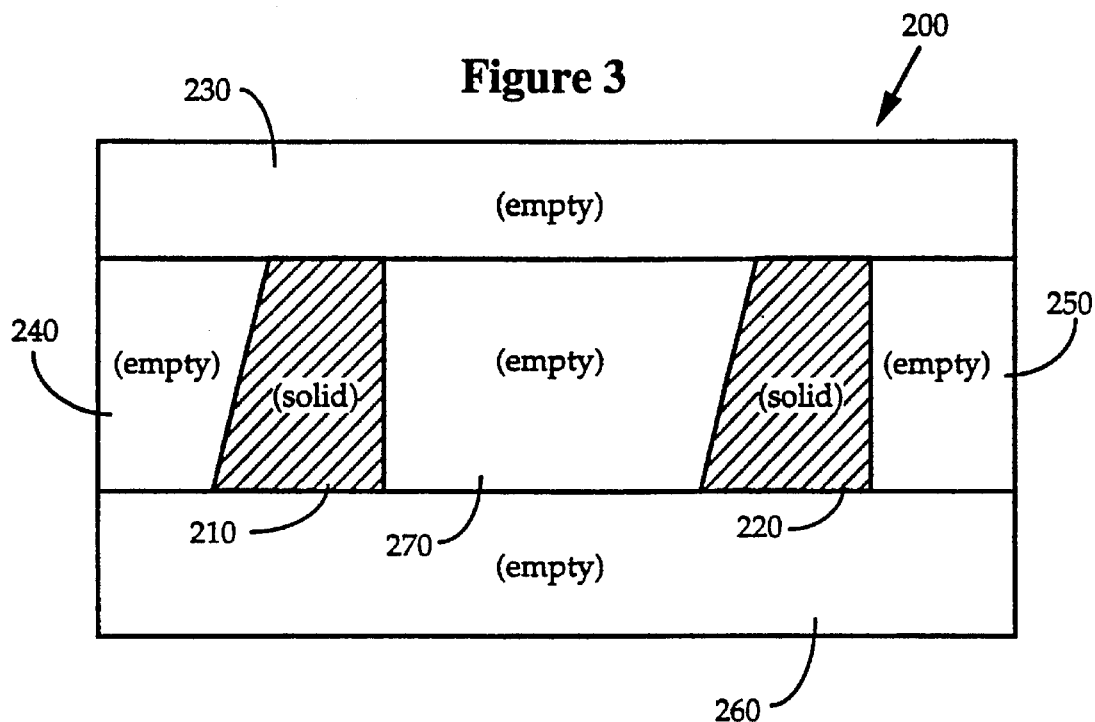
FIGS. 3 and 4 are diagrams illustrating the addition of a cell to an existing layout.
Figure 4:
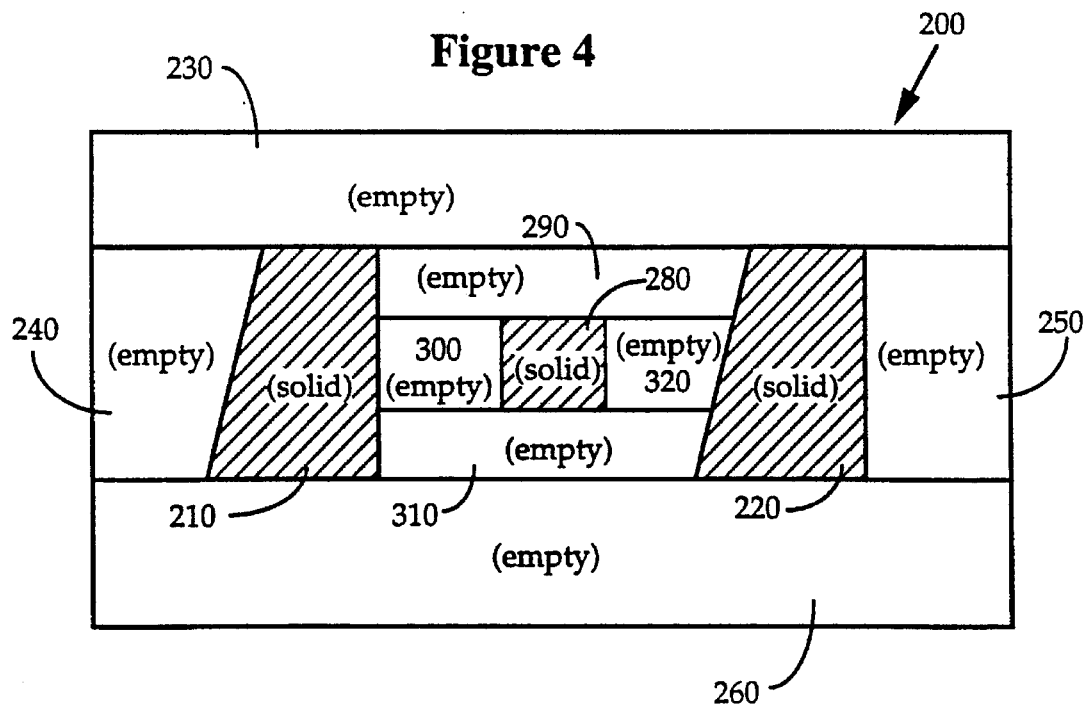

An example of this progression is shown in FIGS. 3 and 4. In FIG. 3, a layout 200 is shown with two solid cells 210 and 220, and five empty cells 230–270. When solid polygon (cell) 280 is added, as in FIG. 4, empty cell 270 is subdivided into newly created empty cells 290–310.

These empty cells can be used by IC CAD applications for routing lines in a layout. IC CAD applications that verify design rule compliance can use these empty cells and the adjacent cells' pointers to quickly check for any violation of design rules governing spacing distances among solid cells.

IC CAD applications that execute compacting procedures can use these cells in their procedures for adjusting coordinate values of the solid cells and maintaining connectivity between adjacent cells. In the data structure 130 (FIG. 2), as discussed above, the cells share edges, and edges share endpoints, such that all cells necessarily stay connected during layout modification procedures (such as compaction). Thus, if a cell is moved, and an adjacent cell shares an edge with the moved cell, this results in an adjustment to the adjacent cell as well. The data structure 130 facilitates the location of and access to all such adjacent cells by the layout modification application, by using the adjacent cell pointer 162 (FIG. 2).

FIG. 5 is a flow chart showing the overall procedure for generating and updating the IC connectivity data structure of the invention. At step 400, input is provided, comprising an arbitrary list of cells with layer information representing the semiconductor mask patterns of an IC. This list may be in conventional format for IC CAD layout data, such as in the widely used CIF (Caltech Intermediate Format), which is a text-based format.

The input list of cells is first prepared by generating a minimal list of cells that will cover the same space as the input list of cells. This is done by the combination of steps 410 and 420. In step 410, the input list of arbitrary cells is "merged", a procedure illustrated in FIGS. 6–7. This involves locating any layout overlaps in a given layer for multiple polygons, and reducing the overlapping polygons to single polygons covering the same space as the aggregate of overlapping polygons.

Figure 6:
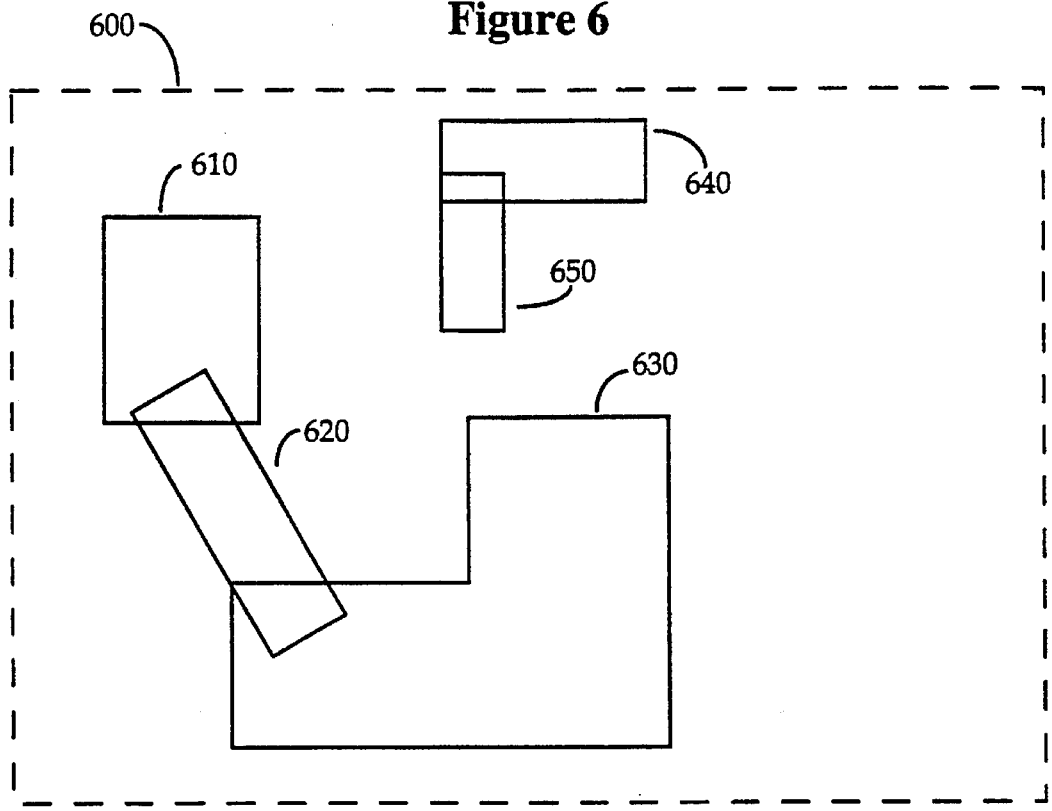
FIG. 6 is a diagram of a layout containing cells before merging like cells together.
Figure 7:
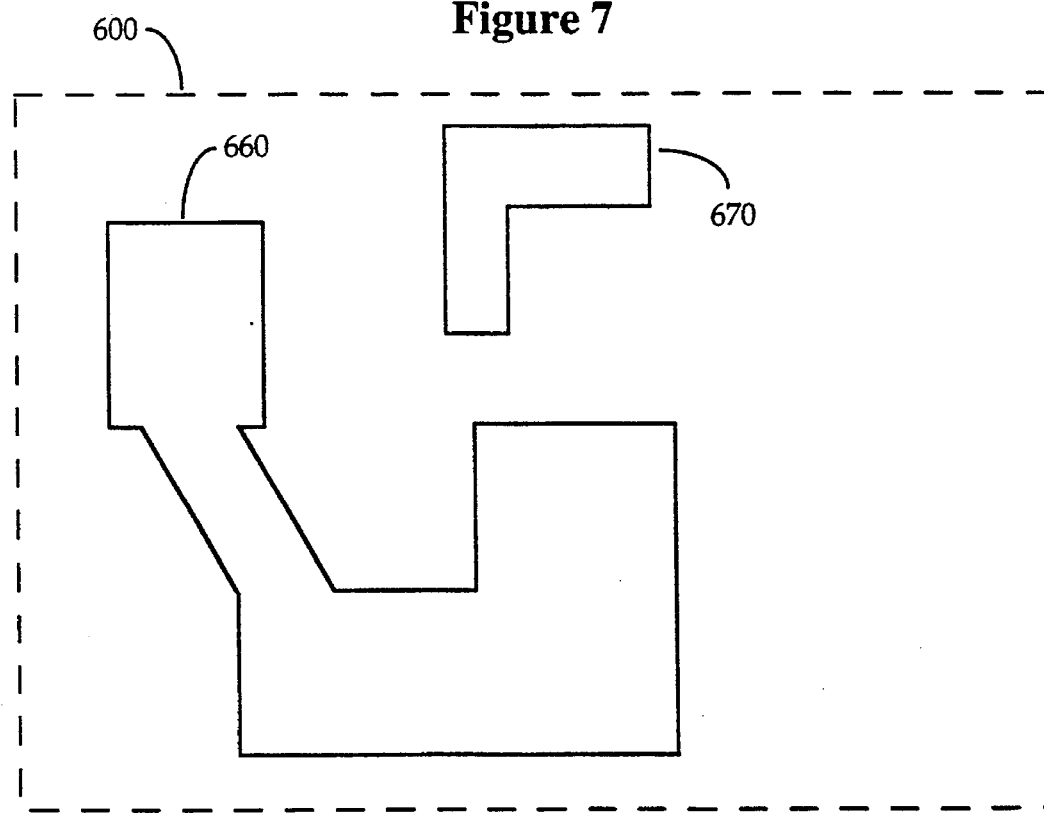
FIG. 7 is a diagram of a layout like that of FIG. 6, with cells of like material merged.

Thus, in FIG. 6, layout 600 includes five cells or polygons 610–650, with cells 610–630 and cells 640–650 overlapping as shown. The overlapping cells are of the same material, and are therefore converted into just two single cells 660 and 670, respectively, as shown in FIG. 7. The list of cells is accordingly minimized, without losing any of the layout information, and the geometry of the layout is considerably simplified.

The next step (420) is to fracture the simplified layout by introducing horizontal edges wherever needed, so as to convert the arbitrary input polygons into a list of convex polygons covering the same space. Because this is done in by horizontal slicing, the polygons in the list are divided to the extent possible into horizontal objects, which is useful for certain applications such as those for compacting the layout.

FIG. 8 shows the way this is done. Horizontal edges 680, 690, 700 and 710 (shown in bold in FIG. 8) are introduced, these being the minimum number of edges necessary to ensure that all the resulting polygons are convex. At the same time, edges 682 and 684, collinear with edge 680, are generated, these three edges being bounded by points 680a–680b, 680c–680d and 680b–680c, respectively (the points being marked for clarity by X's). Edges 690, 695 and 700 are similarly bounded by points 690a–690d as shown, and edges 710 and 715 are bounded in the same fashion by points 710a–710c.

The generation of the horizontal edges 680–682, 690–700 and 710–715 can be done in any methodical manner, such as by starting at the upper left and working towards the lower right, placing edges wherever a concave angle is located. The resulting cell list now includes six cells 720–770 instead of the initial five (610–650), but they are now much better suited to processing by compacting, wire minimization, or other layout processing applications. In particular, they are now well suited for generating the linked data structure of the invention that is to be used by such applications.

As each structure in steps 410–430 is generated and stored, it takes the form of the data structures shown in FIG. 2, including the cell pointers 125, the cell table entries 150, the cell entries 160, and so on. For instance, cell 720 in FIG. 8 has a corresponding cell pointer (in cell list 125 of FIG. 2), and includes pointers to each of its boundaries, such as the boundaries along cell 730, which includes the three edges 680, 682 and 684. The boundary pointer in the cell table 121 that corresponds to edge 680 will point to a cell pointer 160 in boundary table 122, and the cell pointer will in turn have an edge pointer 164 pointing to a first point entry in edge table 123, the first point being point 680b in this case. The "next point" entry will correspond to point 680c. Each of the first and next point entries points to an x,y coordinate stored in the point table 124.

It is a straightforward matter to generate all of these entries, and this is done automatically for each structure (including edges, points, etc.) generated in the procedure of FIG. 5. Given the above description, no further teaching is needed to actually generate such data structure entries; in the following discussion, then, though the details of generating such data structures are not always discussed, it should be taken that whenever a graphic structure is described as being generated, the corresponding object entry is in fact generated and stored in the appropriate tables in the data structure of FIG. 2.

Figure 9:
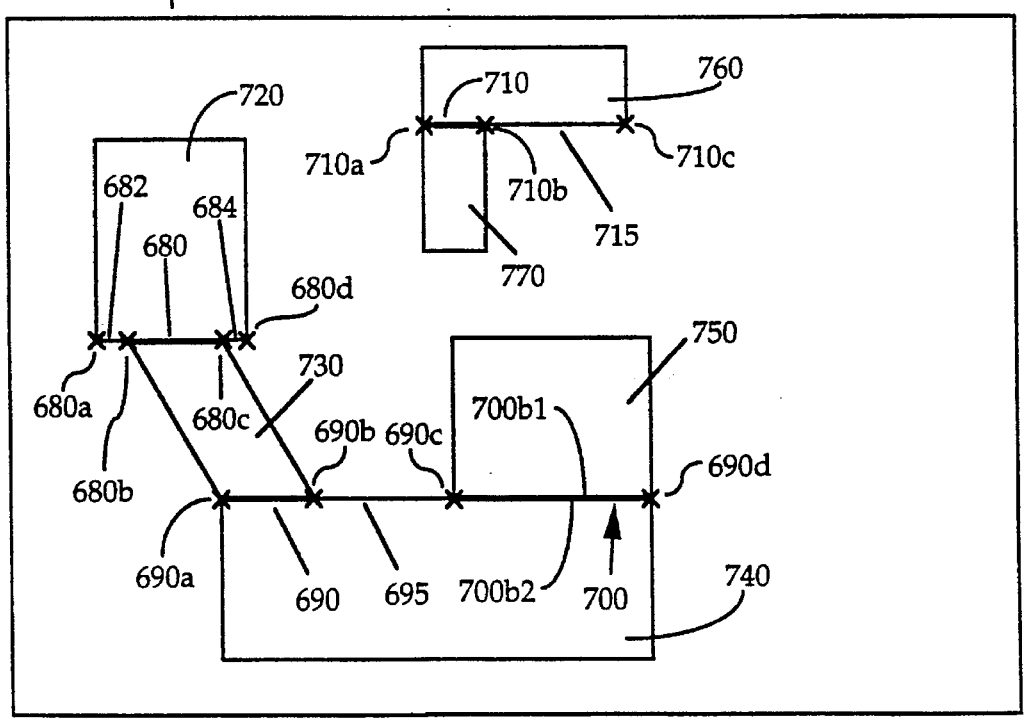
FIG. 9 illustrates the addition to FIG. 8 of a cell containing the entire layout of FIG. 8.

At step 430 of FIG. 5, an initial cell is generated for each IC layer that is at least as large as the overall dimensions of the entire circuit layout. The adjacent cell pointer of the boundaries of each such all-encompassing cell are set to the null pointer, to indicate that there is no adjacent cell. In FIG. 9, cell 780 is generated for the layer represented there.

Adding cells by the subdivision method (Steps 440–500)

Figure 10:
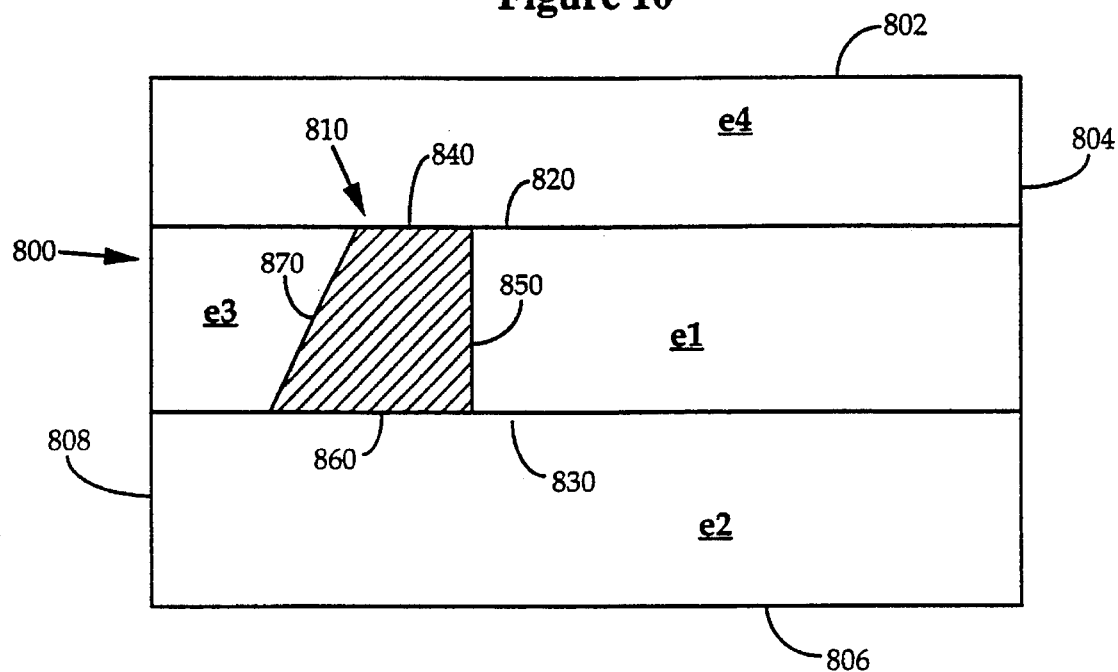
FIG. 10 is a diagram of a layout containing a single solid cell and three empty cells.

Steps 440 through 530 constitute the procedure for adding polygons to a data structure that has been initialized as described above, and will be discussed in connection with adding a single polygon to an existing layout already containing a polygon. FIG. 10 shows such an existing layout 800 with boundaries 802–808, where a solid cell 810 having edges 840–870 defines empty cells e1–e4 bounded in part by horizontal edges 820 and 830, whose positions are determined by edges 840 and 860. The starting point for step 440 includes such a preexisting data structure 130 as in FIG. 2 with its corresponding entries in the various tables.

Figure 11:
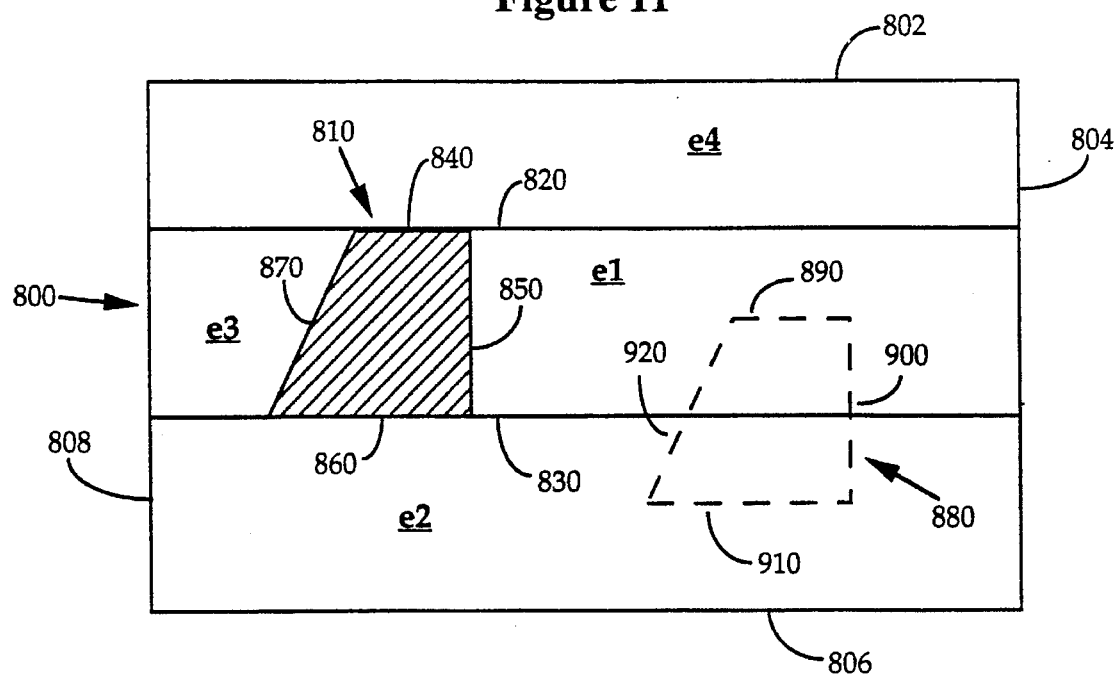
FIG. 11 is a diagram of the layout of FIG. 10, showing the placement of a new solid cell.

In FIG. 11, a new solid cell 880 having edges 890–920 is shown, and is to be added to the connectivity data structure.

The cell 880 is added using the "subdivision" method of the invention. This involves successively dividing existing cells of the layout, using (extensions of) each edge of the newly input cell in turn as the line of division. All cells, and only those cells, that are intersected by an (extended) edge of the new cell are divided.

Figure 12:
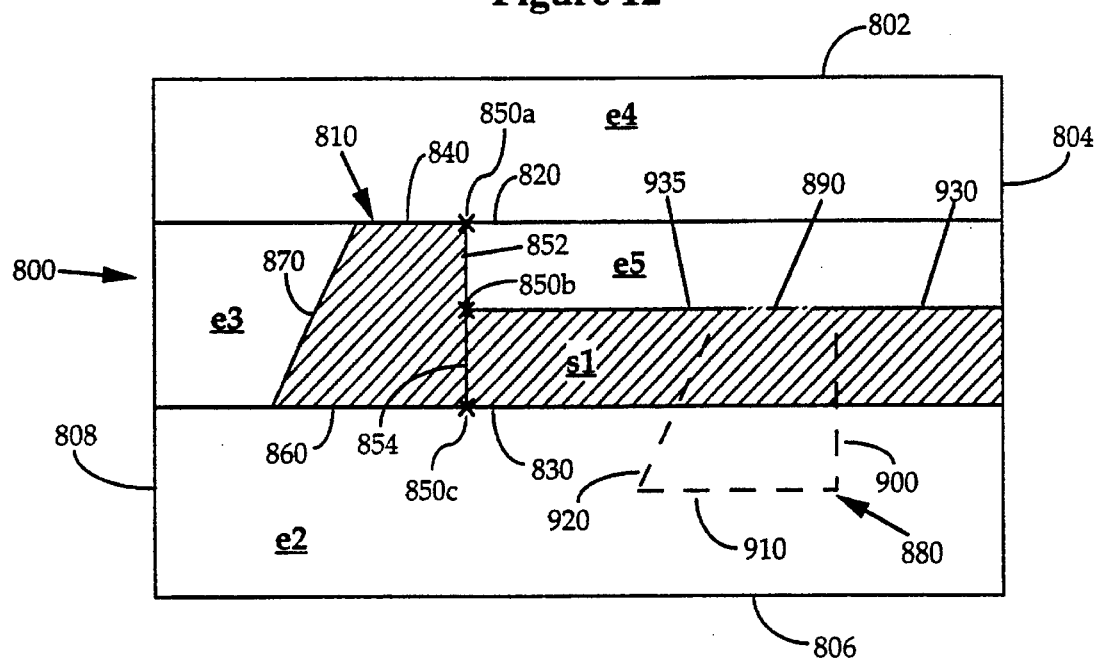
FIG. 12 is a diagram of the layout of FIG. 11, showing the generation of a new edge by the subdivision method of the invention.

The edges 890–920 are considered one at a time, each in turn causing the creation of new cells, either solid or empty, as depicted in the sequence of FIGS. 12–16. In FIG. 12, new edges 930 and 935 are formed, collinear with edge 890 and lying on a division line extending from edge 850 to edge 804. Each such division line extends until it reaches another edge in each direction. It divides empty cell e1 into two parts, the first being empty cell e5 and the second being solid cell s1. Cell s1 is determined to be solid by a method described below.

Following the flow of FIG. 5: at step 440, it is determined that there is still a cell to be processed (cell 880), which is selected at step 450 as the current cell, and the layer to which it is to be added is selected at step 460.

At steps 470–480, a first edge 890 of the cell 880 is recognized as such and selected as the current edge. The method then proceeds to step 500, where the current cell 880 is added to the connectivity structure, and the intersected cell 810 (see FIG. 12) is processed.

Edge 890 is then extended to the next edges along the two directions in which it lies, as mentioned above, creating extended edges 930 and 935. New edge 935 breaks up edge 850 (see FIG. 11) into two edges 852 and 854, bounded as shown by points 850a, 850b and 850c. Thus, corresponding to the line segment where cells 810, s1 and e5 meet, there are defined in the data structure 130 two edges (852 and 854), three points (850a–850c), and four boundaries: one for each of cells 810 and e5 along edge 852, and one for each of cells 810 and s1 along edge 854. When cell s1 is added to the layout as shown in FIG. 12, all of these new data elements and their associated pointers and other entries are stored in the data structure 130.

Edges 935, 890 and 930 are bounded by endpoints 850b–890a, 890a–890b and 890b–890c, respectively. These edges and endpoints and the associated boundaries are all entered into the data structure 130.

Each cell that is occupied by each extended edge of the new cell is subdivided into two parts, and it is determined whether the newly divided cells are solid or empty; thus, as indicated above, original cell e1 has now become empty cell e5 and solid cell s1. The determination of cell solidity is made in the following manner:

CELL SOLIDITY TESTING METHOD

An edge of a cell is for the purpose of this method represented internally to the computer as the set of points meeting the equation of a line whose formula matches the edge. For instance, for edge 930 in FIG. 12, this formula would be "y–N=0", where N is the vertical offset (or y-coordinate) of this horizontal edge relative to a predefined origin. In general, the formula of a line representing an edge will be $$a*x+b*y+c=0. \quad (1)$$

For points not on the edge defined by equation (1), the relationship $$a*x+b*y+c=Z \quad (2)$$

holds, where Z≠0.

Note that the line defined by equation (1) divides the plane of the paper into two. Any two points that lie on the same side of the line, but not on it, will yield Z's that are of the same sign.

For example, in the above equation y–N=0, the general formula is y–N=Z, with Z≠0 for points not on the line. This divides the plane of the paper into a region where y>N, and one where y<N. Values of y where y>N will yield Z values greater than zero, and values of y where y<N will yield Z values less than zero. Thus, to determine whether a given point is on the same side of the line as another, one merely compares the signs of the values of Z that they produce. This is generalizable from y–N=Z to equation (2), and holds equally well in the general case.

Given this test, to determine whether a given cell is solid or not, one compares the Z-value produced by a point within the cell and compares its sign with that of a point in a known solid cell, i.e. one forming a part of the input (solid) polygon.

To carry out this test, the following mathematical entities are defined:

$a*x+b*y+c=0$ is the equation of the reference (division) line;

$(xc1, yc1)$ are the coordinates of some point in a cell c1, but not on the division line;

$(xp1, yp1)$ are the coordinates of some point on the input polygon, also not on the division line.

$Z(c1)=a * xc1+b * xc2+c$ for the cell being tested $Z(p1)=a * xp1+b * xp2+c$ for the input polygon If $Z(p1)$ and $Z(c1)$ have the same sign, then they are on the same side of the line of division, and the test cell c1 is a solid cell. Otherwise, they are on opposite sides of the line, and the test cell c1 is an empty cell.

Using this test in the case of cell s1, we determine that this cell is on the same side of the division line 930 as the input polygon 880, so cell s1 is a solid cell. The cell type field for cell 120 is stored, with the type of material being specified as whatever the same type as this input polygon.

Once step 500 is executed, the method returns to step 490 to determine whether the current division line (along edges 935–890–930) intersects another cell. In this case, the result is negative, so the method returns to step 470, where it is determined that there is another edge of the current cell to be considered. This is positive.

Figure 13:
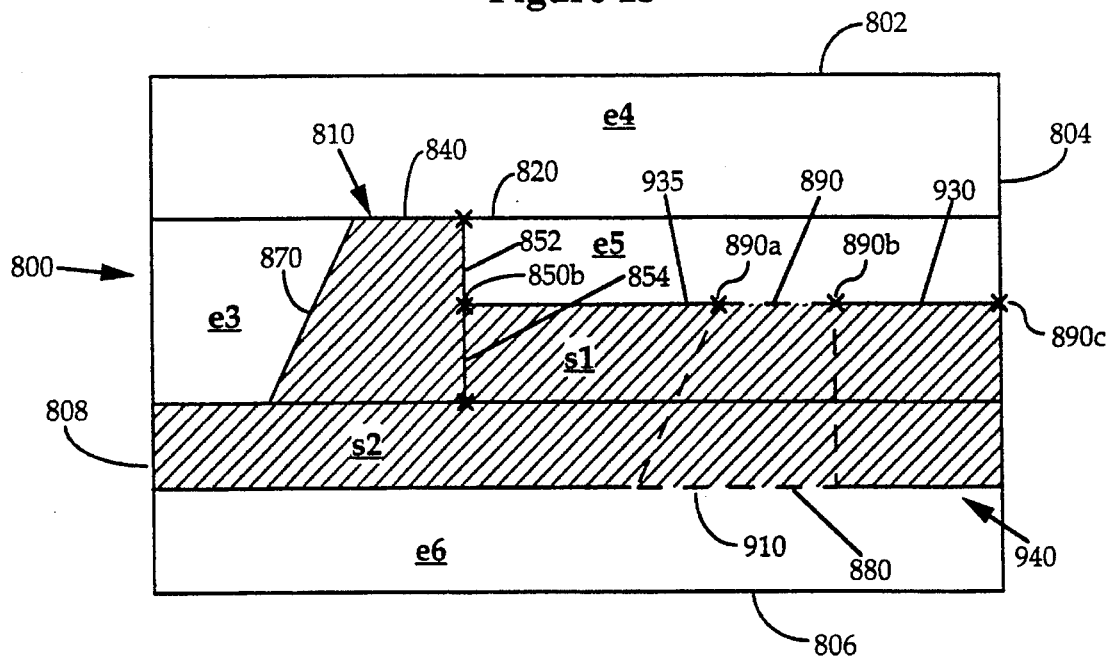
FIGS. 13–15 are diagrams like that of FIG. 12, showing the generation of additional new edges by the subdivision method of the invention.

At step 480, the method selects edge 910 (see FIG. 12) as the next edge, and at step 500 a division line or edge 940 (collinear with edge 910) is generated, as shown in FIG. 13. Edge 940 forms cell s2—which by the above method is determined to be solid—as well as cell e6, which is determined to be empty. Note that former cell e2 has been split into the two new cells s2 and e6.

Figure 14:
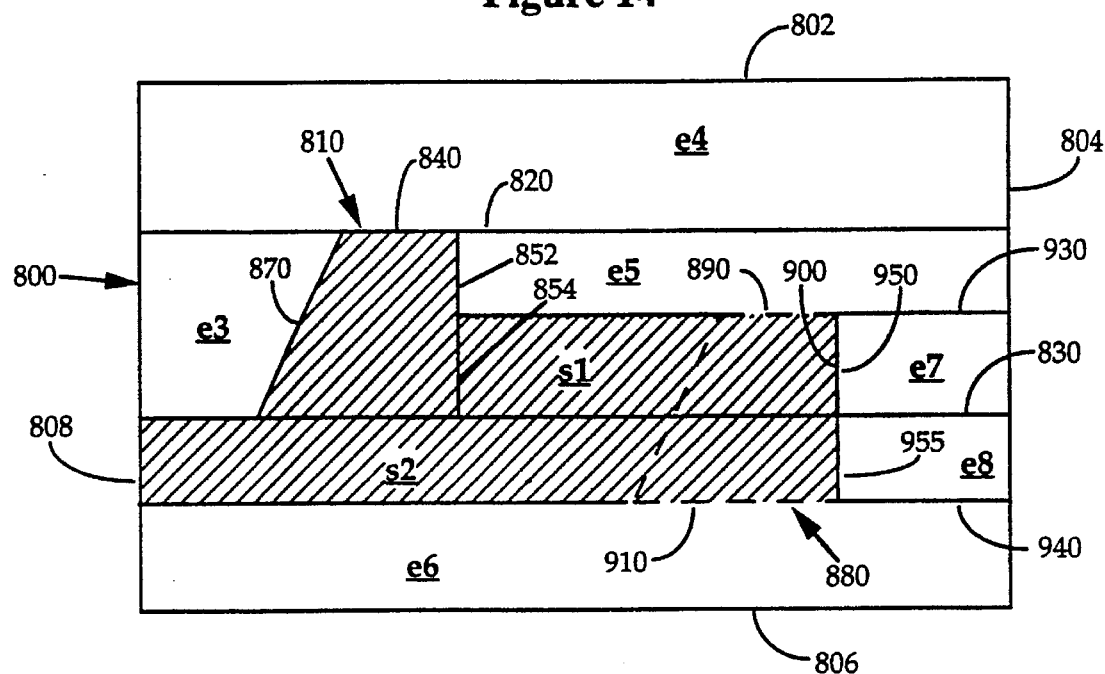

Returning to step 490, division line 940 does not intersect any other cells, so the method proceeds to step 470, and the next edge of the cell 890 (here, edge 900) is selected at step 480. FIG. 14 shows the addition of new edges 950 and 955 (per step 500), lying along edge 900. The endpoints of the edges are not marked in the figures, but are generated as before for each new edge in the procedure.

Edge 950 extends from edge 930 to the position of original edge 830, since all new division edges end at the first object(s) they intersect. Edge 955 likewise extends from edge 830 to edge 940.

Edges 950 and 955 together split off cells e7 and e8 from cells s1 and s2, respectively, and these new cells e7 and e8 are determined by the above method to be empty. All of the new cells, edges, boundaries, and points are added to the data structure.

Figure 15:
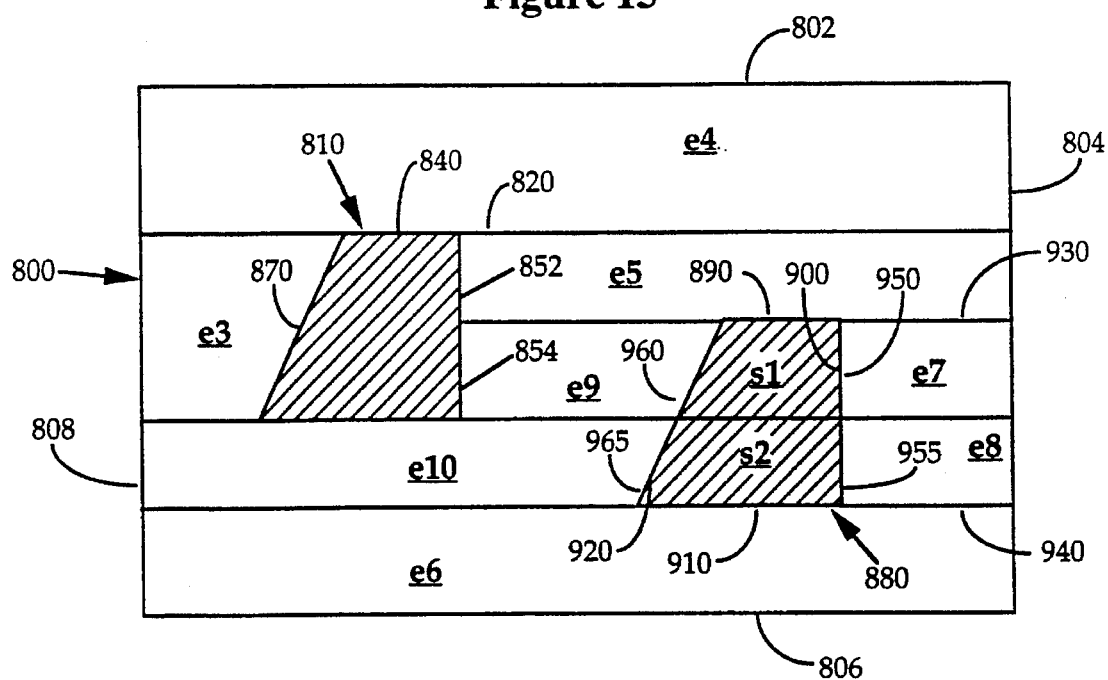

Returning to step 490 again leads to step 470. In FIG. 15, edge 920 is selected (step 480) and new edges 960 and 965 are added (step 500), forming a division line coextensive with original edge 920. This division line divides cells s1 and s2, creating new cells e9 and e10, which are determined to be empty by the cell solidity testing method, using the formula for the line along edge 960 as the reference line. The new data objects are added to the data structure.

Figure 16:
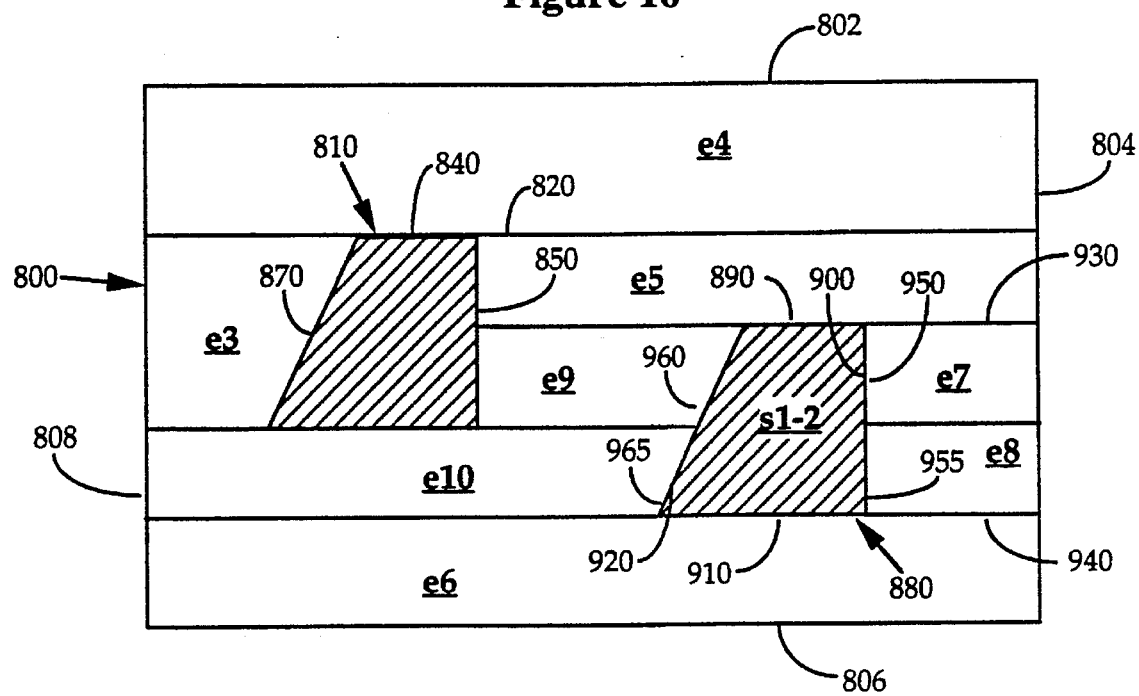
FIG. 16 is a diagram like that of FIG. 15, showing the merging of two solid input cells into a single cell.

The test at step 490 is negative, as is now the test at step 470. This completes the input of the new polygon 880, and the method proceeds to step 510. As shown in FIG. 15, the input cell 880 is now defined by solid cells s1 and s2, and the cells surrounding it have been split into smaller cells e5–e10. Adjacent cells of the same type will be merged in a later step, as shown in FIG. 16 and discussed below.

Empty cells e5–e10 overlap previously existing empty cells e1–e2 (compare FIG. 15 with FIG. 10), so the type field for these cells will by default be the same as the cells e1–e2. In general, the type field for any cell identified as "empty" by the solidity determination method discussed above will in fact be specified as the same as the type field of an underlying, previously existing cell, whether the latter is empty or of some particular material. This takes care of the possibility that the cells generated by a newly added polygon such as cell 880 might overlie a previously existing polygon which is of a non-empty type.

LINKING CELLS BETWEEN LAYERS

Figure 17:
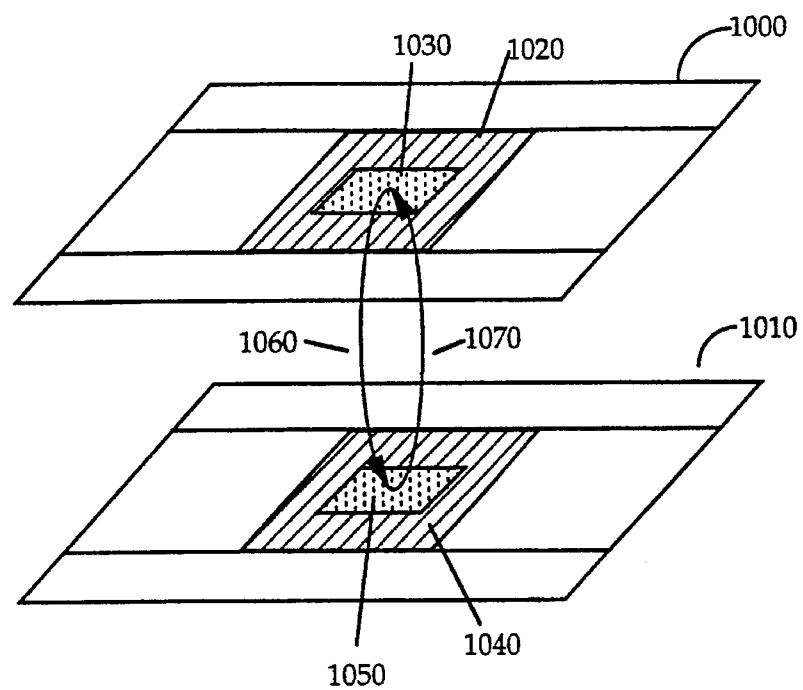
FIG. 17 illustrates the connecting of two cells across layers in a layout of the invention.

Certain types of cell materials are used for connecting cells between different layers of the layout; these include "contact" and "via" materials (see the cell type table 120 in FIG. 2). Step 510 involves the linking of such cells across layers, and is illustrated in FIG. 17, which shows two layers 1000 and 1010. Layer 1000 includes a cell 1020 and a connecting cell 1030, and layer 1010 similarly includes a cell 1040 and a connecting cell 1050.

Cells 1030 and 1050 have overlapping x-y dimensions, and are of a material, such as contact or via, that is specified for connecting cells, and the method at step 510 therefore generates link between them. A "related cell" pointer is generated for each of these two cells (see cell table 121 in FIG. 2), represented in FIG. 17 by pointers 1060 and 1070.

Figure 18:
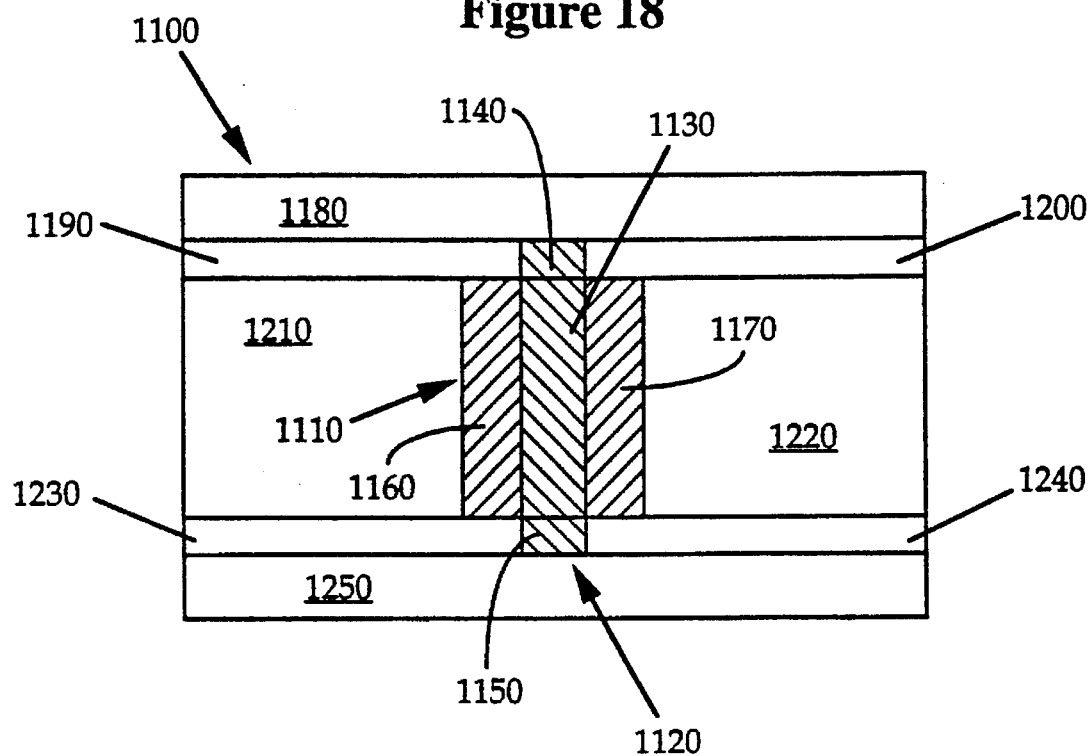
FIG. 18 shows the addition of an input cell to a layout, overlapping with an existing cell of a different type of material.
Figure 19:
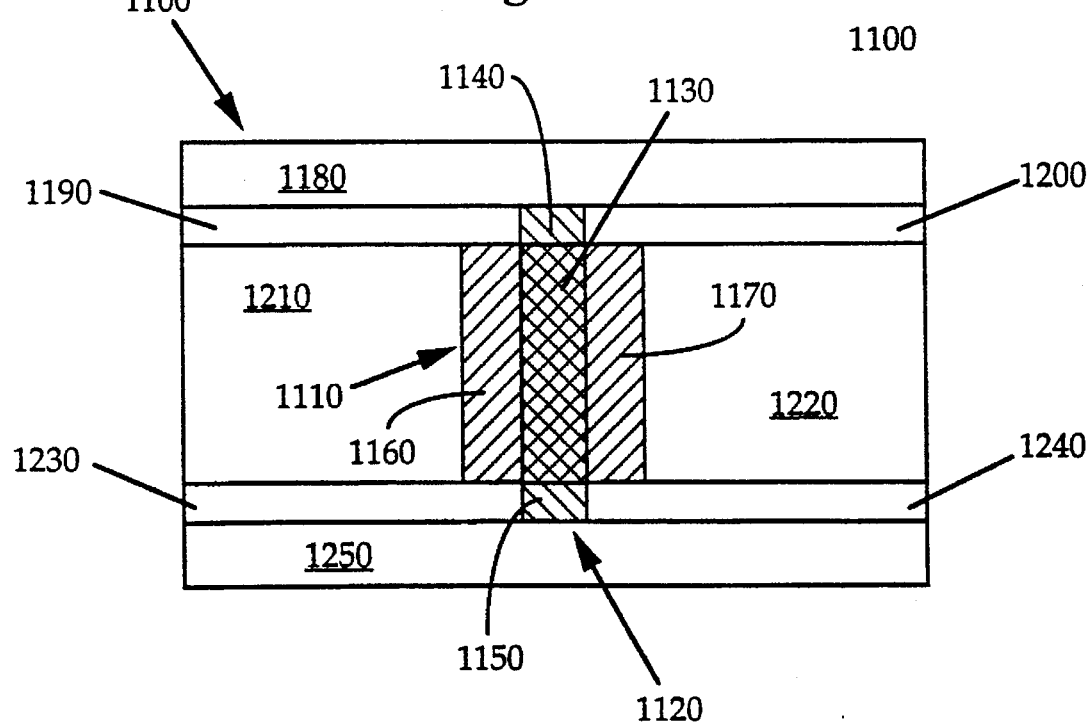
FIG. 19 illustrates the result of executing a logical OR operation on the overlap region shown in FIG. 18.

FIGS. 18 and 19 illustrate the next step in the procedure, step 520, where any newly created cells that overlap are logically OR-ed to indicate that the material in the area of the overlap includes both of the materials of the individual cells. Thus, if a layout 1000 includes a cell 1110 of a first material and a cell 1120 of another material is added, a pattern such as that shown in FIG. 18 results, with an overlap cell region 1130, four smaller solid cells 1140–1170, and empty cells 1180–1250.

A typical instance in which this might occur is when a polysilicon layer is positioned atop a diffusion layer; for example, input cell 1130 may be polysilicon, and cell 1110 diffusion.

When cell 1130 is added to the data structure, resulting cells 1140 and 1150 are of the same material as cell 1130, such as polysilicon, and resulting cells 1160 and 1170 are of the same material as cell 1110, such as diffusion. The overlap region 1130 will be specified as the logical OR of polysilicon and diffusion. This may be accomplished by forming the type field for each cell as a bit string, where each bit represents one of the available materials, such as those listed in the cell types table 120 in FIG. 2. When two cell types overlap, as for cell 1130, this is specified by logically OR-ing the bit strings for the two different materials, so that effectively both materials are specified. A simple example of this is as follows: polysilicon may be represented by the bit string 0001, and N-diffusion as 0010, so the logical OR of these two bit fields is 0011. Whenever the system inquires as to whether cell 1130 is either one of these materials, the result will be positive.

FIG. 19 represents the result, in which the overlapping cell region 1130 is cross-hatched, indicating that its material is the same as either one of the constituent materials of cells 1110 or 1120.

Step 530 is now reached, wherein solid cells that are of the same type are combined, so as to minimize the total number of solid cells in the connectivity data structure. In the example discussed above relative to FIGS. 10–15, this results in solid cells s1 and s2 being combined into a single cell s1-2.

The merging process combines only those cells that, when merged, will result in a convex cell. Thus, cells s1 and s2 in FIG. 16 may be merged.

Once the above method has been completed, a data structure of the type shown in FIG. 2 is stored in the memory 106 shown in FIG. 1. The comprehensive connectivity of the data structure allows extensive modifications to the layout, such as in compaction routines or other conventional circuit manipulation routines, with high efficiency and rapid, exhaustive treatment of all objects that are adjacent to or otherwise logically related (such as through via cells) to one another. The method of generating the data structure itself allows rapid entry of the data representing the objects in the layout. Given the above description, it is a straightforward matter to generate code for execution on a conventional computer (such as CPU 102 shown in FIG. 1) that allows a user to input the layout objects easily, most preferably to enter them graphically in a system with a graphical user interface. The user need not take any steps but to generate and place objects in a manner conventional to drawing applications, with the above method taking care of storing the objects in the manner represented in FIG. 2.

What is claimed is:

1. A method executed by a computer under the control of a program, said computer including a memory for storing said program, said method comprising the steps of:

(1) receiving in said computer a list of cells representing a circuit layout, each cell having a specified type;

(2) storing in said memory a cell record in a cell table for each received cell, each said cell record including a boundary pointer pointing to a boundary record in a boundary table, each boundary record including an adjacent cell pointer, an edge pointer and a next entry pointer for the next record in the boundary table, the adjacent cell pointer pointing to a cell adjacent to the cell for the current boundary record, if any, and the edge pointer pointing to an edge record in an edge table;

(3) selecting a cell as the current cell;

(4) selecting an edge of the current cell as the current edge;

(5) generating a division line along the current edge;

(6) subdividing any edges stored in the data structure that are intersected by the generated division line into smaller edges, and generating and storing one said edge record for each of the smaller edges;

(7) repeating steps 4–6 until each edge of the current cell has been processed by said steps 4–6;

(8) repeating steps 3–7 until each cell has been processed by said steps 3–7; and (9) storing in each edge record a first endpoint entry and a second endpoint entry, the first endpoint entry including a pointer to a point record in a point table, each point record including entries representing coordinates of the point represented by the point record.

2. The method of claim 1, including, after step 2 and before step 3, the step of merging adjacent cells of the same type, and storing the merged cells as single cells.

3. The method of claim 1, including, after step 2 and before step 3, the step of fracturing cells along a predetermined dimension to generate convex cell structures, and storing the convex cell structures.

4. The method of claim 1, wherein step 2 includes the step of storing as an entry in said cell record a related cell pointer pointing to a cell contacting the cell represented by the cell record, but positioned in a different layer of the layout.

5. The method of claim 1, wherein step 9 further includes the step of generating and storing with each said point record an entry representing a move distance for the referenced point in the execution of a layout modification routine.

6. The method of claim 1, further including, after step 8 and before step 9, the step of merging adjacent cells of like material where such merging results in convex structures, and storing the merged cells in the memory.

7. A computer readable memory that can be used to direct a computer to function in a specified manner, comprising:

cell data stored in said memory, said cell data including:

(1) a list of cells representing a circuit layout, each cell having a specified type, (2) a cell record in a cell table for each cell of said list of cells, each said cell record including a boundary pointer pointing to a boundary record in a boundary table, each boundary record including an adjacent cell pointer, an edge pointer and a next entry pointer for the next record in the boundary table, the adjacent cell pointer pointing to a cell adjacent to the cell for the current boundary record, if any, and the edge pointer pointing to an edge record in an edge table; and executable instructions stored in said memory, said executable instructions including:

(3) instructions to select a cell as the current cell, (4) instructions to select an edge of the current cell as the current edge, (5) instructions to produce a division line along the current edge, (6) instructions to subdivide any edges stored in the data structure that are intersected by the generated division line into smaller edges and thereafter store one said edge record for each of the smaller edges, (7) loop control instructions for repeating the execution of instructions (4)–(6) until each edge of the current cell has been processed by instructions (4)–(6), (8) loop control instructions for repeating the execution of instructions (3)–(7) until each cell has been processed by instructions (3)–(7), and (9) instructions to store in each edge record a first endpoint entry and a second endpoint entry, the first endpoint entry including a pointer to a point record in a point table, each point record including entries representing coordinates of the point represented by the point record.

8. The computer readable memory of claim 7 further comprising instructions, executed between instructions (2) and (3), to merge adjacent cells of the same type and store the merged cells as single cells.

9. The computer readable memory of claim 7 further comprising instructions, executed between instructions (2) and (3), to fracture cells along a predetermined dimension to generate and store convex cell structures.

10. The computer readable memory of claim 7 wherein instructions (2) include instructions to store as an entry in said cell record a related cell pointer pointing to a cell contracting the cell represented by the cell record, but positioned in a different layer of the layout.

11. The computer readable memory of claim 7 wherein instructions (9) include instructions to generate and store with each said point record an entry representing a move distance for the referenced point in the execution of a layout modification routine.

12. The computer readable memory of claim 7 further comprising instructions, executed between instructions (8) and (9), to merge adjacent cells of like material where such merging results in convex structures, and to store the merged cells in the memory.

* * * * *